(12) United States Patent
Imamura et al.

(10) Patent No.: US 9,320,185 B2
(45) Date of Patent: Apr. 19, 2016

(54) METHOD OF MANUFACTURING A COMPONENT-EMBEDDED SUBSTRATE

(75) Inventors: Yoshio Imamura, Ayase (JP); Tohru Matsumoto, Ayase (JP); Ryoichi Shimizu, Ayase (JP)

(73) Assignee: MEIKO ELECTRONICS CO., LTD., Ayase-Shi, Kanagawa (JP)

(*) Notice: Subject to any disclaimer, the term of this patent is extended or adjusted under 35 U.S.C. 154(b) by 279 days.

(21) Appl. No.: 13/824,437

(22) PCT Filed: Oct. 1, 2010

(86) PCT No.: PCT/JP2010/067259
§ 371 (c)(1),
(2), (4) Date: May 31, 2013

(87) PCT Pub. No.: WO2012/042667
PCT Pub. Date: Apr. 5, 2012

(65) Prior Publication Data
US 2013/0242516 A1    Sep. 19, 2013

(51) Int. Cl.
*H05K 13/00* (2006.01)
*H05K 1/02* (2006.01)
*H05K 1/18* (2006.01)
*H05K 1/16* (2006.01)

(52) U.S. Cl.
CPC .......... *H05K 13/0023* (2013.01); *H05K 1/0269* (2013.01); *H05K 1/16* (2013.01); *H05K 1/188* (2013.01); *H05K 2201/09781* (2013.01); *H05K 2201/09918* (2013.01)

(58) Field of Classification Search
CPC ......... H05K 1/11; H05K 1/111; H05K 1/185; H05K 3/00; H05K 1/0269; H05K 1/16; H05K 13/0023; H05K 2201/09781; H05K 2201/09918
See application file for complete search history.

(56) References Cited

U.S. PATENT DOCUMENTS

| | | | |
|---|---|---|---|
| 5,022,580 A | 6/1991 | Pedder | |
| 5,186,383 A * | 2/1993 | Melton et al. | 228/180.22 |
| 2003/0000734 A1* | 1/2003 | Nakagawa | 174/250 |

(Continued)

FOREIGN PATENT DOCUMENTS

| | | | |
|---|---|---|---|
| JP | 08242276 A | * | 9/1996 |
| JP | 10163365 A | * | 6/1998 |

(Continued)

OTHER PUBLICATIONS

International Search Report for PCT/JP2010/067259, mailed Dec. 7, 2010.

(Continued)

*Primary Examiner* — Carl Arbes
(74) *Attorney, Agent, or Firm* — Marshall, Gerstein & Borun LLP (57) ABSTRACT

A thin conductive layer which is to form a conductor pattern (18) is prepared, a mask layer (3) is formed on the conductive layer except a plurality of actual connection spots and at least one dummy connection spot on the conductive layer, actual solder pads (6) and a dummy solder pad (7) are formed, with use of solder, on the actual connection spots and the dummy connection spot, respectively, where the conductive layer is exposed, connection terminals (9) of an electric or electronic component (8) are connected to the actual solder pads (6), an insulating base (16) of resin is formed which is laminated directly on or indirectly via the mask layer (3) on the conductive layer and in which the component (8) is embedded, and part of the conductive layer is removed by using the dummy solder pad (7) as a reference, to form the conductor pattern (18).

4 Claims, 6 Drawing Sheets

(56) References Cited

U.S. PATENT DOCUMENTS

| | | |
|---|---|---|
| 2009/0205202 A1 | 8/2009 | Tanaka et al. |
| 2009/0293271 A1 | 12/2009 | Tanaka |
| 2010/0103635 A1 | 4/2010 | Tuominen et al. |

FOREIGN PATENT DOCUMENTS

| | | | |
|---|---|---|---|
| JP | 3645136 B2 * | 5/2005 | |
| JP | 2005-159345 A | 6/2005 | |
| JP | 20066261463 A * | 9/2006 | |
| JP | 2007-027510 A | 2/2007 | |
| JP | 2010-027917 A | 2/2010 | |

OTHER PUBLICATIONS

Written Opinion for PCT/JP2010/067259, mailed Dec. 7, 2010.

Extended European Search Report from Application No. EP 10 85 7880, dated Oct. 28, 2014, 7 pages.

* cited by examiner

METHOD OF MANUFACTURING A
COMPONENT-EMBEDDED SUBSTRATE

TECHNICAL FIELD

The present invention relates to a component-embedded substrate manufacturing method capable of high-accuracy pattern formation, and a component-embedded substrate manufactured using the method. cl BACKGROUND ART There have been known component-embedded substrates having electric or electronic components embedded therein (see Patent Document 1, for example). A component-embedded substrate as typified by the one disclosed in Patent Document 1 is fabricated by laminating an electrically insulating base such as a prepreg on a component, and then partly removing an outside electrically conductive layer by etching or the like, to form a conductor pattern. When the pattern is to be formed, however, difficulty arises in aligning the pattern with the terminals of the component. Thus, using an electrically conductive substance such as copper, a mark is formed on a core substrate, which is an insulating base with a hole permitting the component to be inserted therein, and the core substrate is subjected to lamination along with the component. The buried mark is detected by means of X rays to form a through hole passing through the mark, and a conductor pattern is formed using the through hole as a reference, to improve the positional accuracy of the conductor pattern. However, forming a mark on the core substrate requires the same amount of labor as forming an ordinary conductor pattern, and also an additional process needs to be performed for that purpose.

There has also been known a method in which a hole is formed beforehand in an electrically conductive layer such as a copper foil, a solder resist is formed using the hole as a reference, X-ray hole cutting is performed following lamination by using the hole as a reference, a guide hole is formed using the X rays-cut hole as a reference, and a conductor pattern is formed using the guide hole as a reference, to improve positional accuracy. This method, however, involves multiple processes performed using different holes as reference positions, and actual positional accuracy is low. In practice, moreover, the resin of prepreg flows into the hole formed in the conductive layer, making it difficult to fabricate a satisfactory substrate.

PRIOR ART DOCUMENT

Patent Document

Patent Document 1: Japanese Laid-open Patent Publication No. 2010-27917

SUMMARY OF THE INVENTION

Problem to be Solved by the Invention

The present invention was created in view of the aforementioned conventional techniques, and an object thereof is to provide a component-embedded substrate manufacturing method whereby a conductor pattern can be formed with high positional accuracy relative to an embedded component without the need for complicated process, and a component-embedded substrate manufactured using the method.

Means for Solving the Problem

To achieve the object, the present invention provides a method of manufacturing a component-embedded substrate, comprising: preparing a thin electrically conductive layer which is to form a conductor pattern; forming a mask layer on the conductive layer except a plurality of actual connection spots and at least one dummy connection spot on the conductive layer; forming, with use of solder, actual solder pads and a dummy solder pad on the actual connection spots and the dummy connection spot, respectively, where the conductive layer is exposed; connecting connection terminals of an electric or electronic component to the actual solder pads; forming an electrically insulating base of resin which is laminated directly on or indirectly via the mask layer on the conductive layer and in which the component is embedded; and removing part of the conductive layer by using the dummy solder pad as a reference, to form the conductor pattern.

Preferably, a reference hole penetrating through the dummy solder pad and a portion of the conductive layer in contact with the dummy solder pad is formed, and using the reference hole as a reference, part of the conductive layer is removed to form the conductor pattern.

Also, an X-ray irradiation device is preferably used when the dummy solder pad is detected as the reference.

Preferably, when the connection terminals are connected to the actual solder pads, the component is aligned using the dummy solder pad as a reference position.

The reference hole is preferably formed so as to penetrate through the insulating base.

The present invention also provides a component-embedded substrate manufactured using the method according to claim 1, wherein the substrate comprises: the conductor pattern; the insulating base; and the component.

Preferably, the component-embedded substrate further comprises the mask layer embedded in the insulating base and used for forming the dummy connection spot.

Also preferably, the component-embedded substrate further comprises the dummy solder pad embedded in the insulating base.

Advantageous Effects of the Invention

According to the present invention, the actual connection spots and the dummy connection spot are formed on the conductive layer and thus are located on the same plane. Thus, even if the conductive layer is displaced sideways, the interval between each actual connection spot and the dummy connection spot remains unchanged. The actual solder pads of solder are formed on the respective actual connection spots, and the component is connected to the actual solder pads. On the other hand, the dummy solder pad of solder is formed on the dummy connection spot, and using the dummy solder pad as a reference, the conductor pattern is formed. These steps, in combination with the fact that the relative positional relations between the dummy connection spot and the actual connection spots are maintained, make it possible to improve the positional accuracy of the conductor pattern relative to the component. Also, the dummy solder pad used for improving the positional accuracy can be formed by the same process as that for forming the actual solder pads on which the component is to be mounted. No complicated process is therefore required for improving the positional accuracy of the conductor pattern. Further, the actual solder pads and the dummy solder pad are formed by an identical process and accordingly, with identical accuracy. This makes it possible to further improve relative positional accuracy of the actual solder pads and the dummy solder pad.

Also, the reference hole penetrating through the dummy solder pad enables the reference position to be clearly identified.

Further, the X-ray irradiation device is used for detecting the dummy solder pad, whereby the dummy solder pad can be accurately detected.

The component is aligned using the dummy solder pad as a reference position, and since the positional accuracy of the component and that of the conductor pattern are based on the same reference, relative positional accuracy of the component and the conductor pattern improves.

MODE FOR CARRYING OUT THE INVENTION

Figure 1:
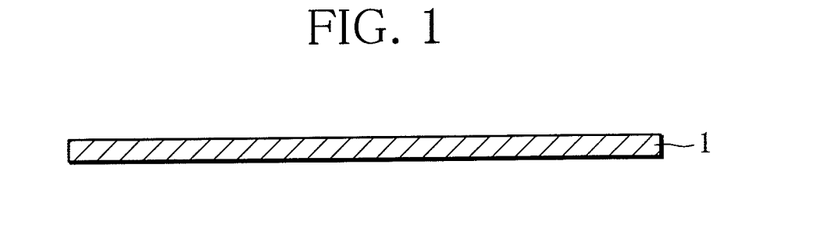
FIG. 1 schematically illustrates a component-embedded substrate manufacturing method according to the present invention.
Figure 2:
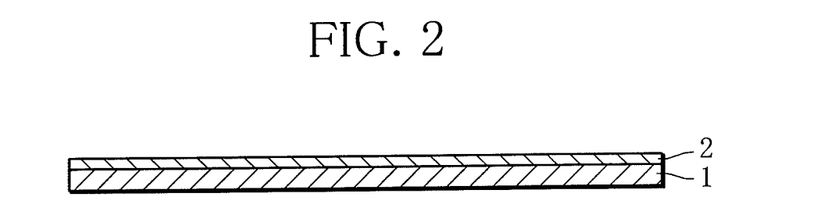
FIG. 2 schematically illustrates the component-embedded substrate manufacturing method according to the present invention.
Figure 3:
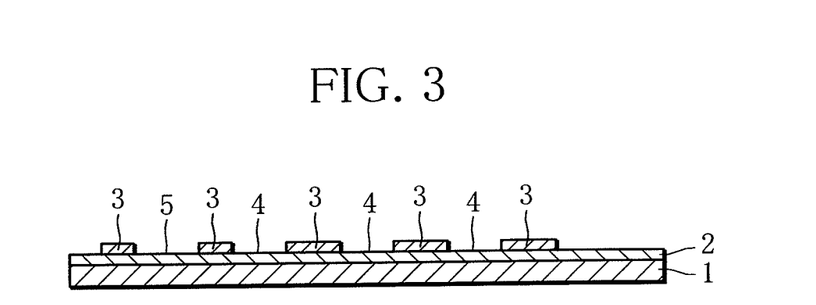
FIG. 3 schematically illustrates the component-embedded substrate manufacturing method according to the present invention.

As illustrated in FIG. 1, a supporting plate 1 is prepared first. The supporting plate 1 is, for example, a SUS plate. Then, as shown in FIG. 2, a thin electrically conductive layer 2 is formed over the supporting plate 1. The conductive layer 2 is formed, for example, by copper plating. Subsequently, a mask layer 3 is formed on the conductive layer 2, as shown in FIG. 3. The mask layer 3 is a solder resist, for example, and is formed such that predetermined portions of the conductive layer 2 are exposed. The exposed regions serve as actual connection spots 4 and a dummy connection spot 5. The positions of the actual and dummy connection spots 4 and 5 are determined beforehand. Specifically, the positions of the actual connection spots 4 are determined taking into account the positions of actual solder pads 6 (see FIG. 4) formed so as to mount a component 8 (see FIG. 5) on the conductive layer 2 which is to form a conductor pattern 18 (see FIG. 10). The position of the dummy connection spot 5 is determined taking into account the position of a dummy solder pad 7 (see FIG. 4) formed so as to improve the positional accuracy of the conductor pattern 18.

Figure 4:
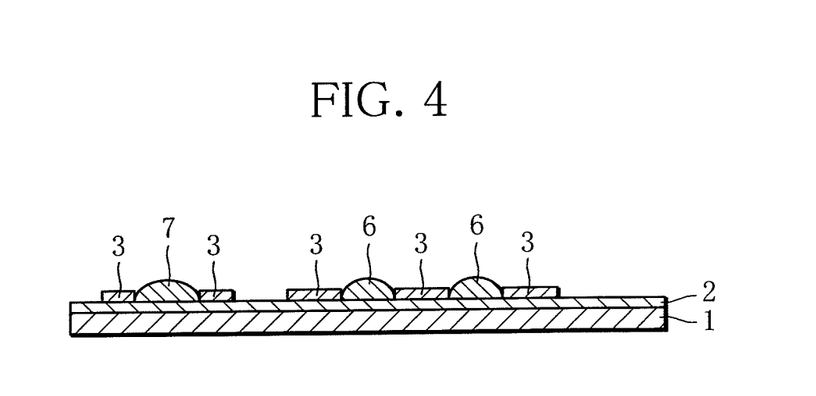
FIG. 4 schematically illustrates the component-embedded substrate manufacturing method according to the present invention.
Figure 5:
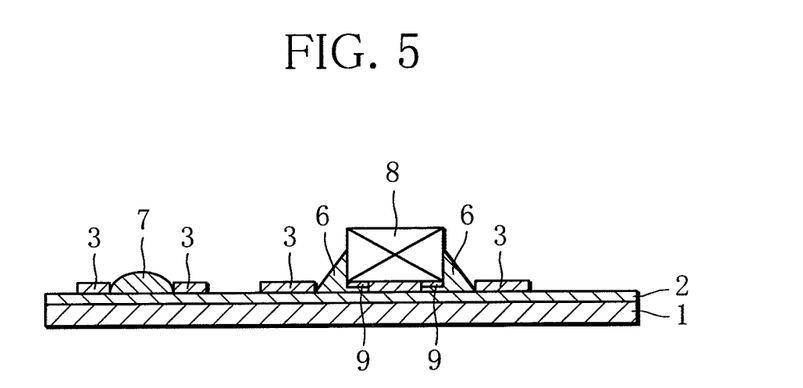
FIG. 5 schematically illustrates the component-embedded substrate manufacturing method according to the present invention.

Then, using solder, the actual solder pads 6 are formed on the respective actual connection spots 4 and the dummy solder pad 7 is formed on the dummy connection spot, as illustrated in FIG. 4. Next, as shown in FIG. 5, an electric or electronic component 8 is prepared and connection terminals 9 thereof are connected to the respective actual solder pads 6, whereby the conductive layer 2 and the component 8 are electrically connected to each other.

Figure 6:
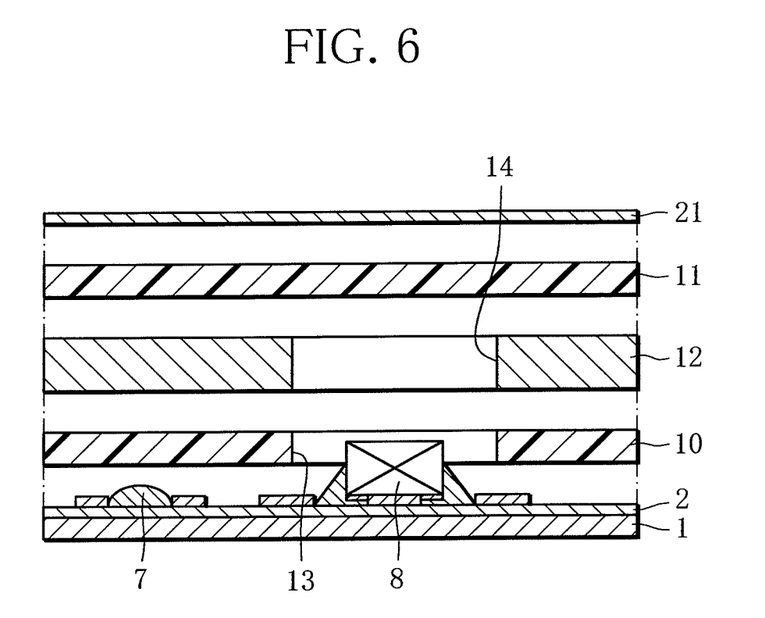
FIG. 6 schematically illustrates the component-embedded substrate manufacturing method according to the present invention.

Subsequently, electrically insulating bases 10 and 11 and a core substrate 12 are prepared, as shown in FIG. 6. The insulating bases 10 and 11 and the core substrate 12 are each made of resin. The insulating bases 10 and 11 are each what is called a prepreg. The insulating base 10 and the core substrate 12 have through holes 13 and 14 formed therein, respectively, and the through holes 13 and 14 each have a size large enough to permit the component 8 to be inserted therein. The through holes 13 and 14 are formed in such positions that when the insulating base 10 and the core substrate 12 are laminated one upon the other, the through holes 13 and 14 are aligned with each other and form a continuous hole. With the component 8 inserted into the through holes 13 and 14, the upper insulating base 11 and further an upper electrically conductive layer 21 are superposed, and the resulting structure is compressed.

Figure 7:
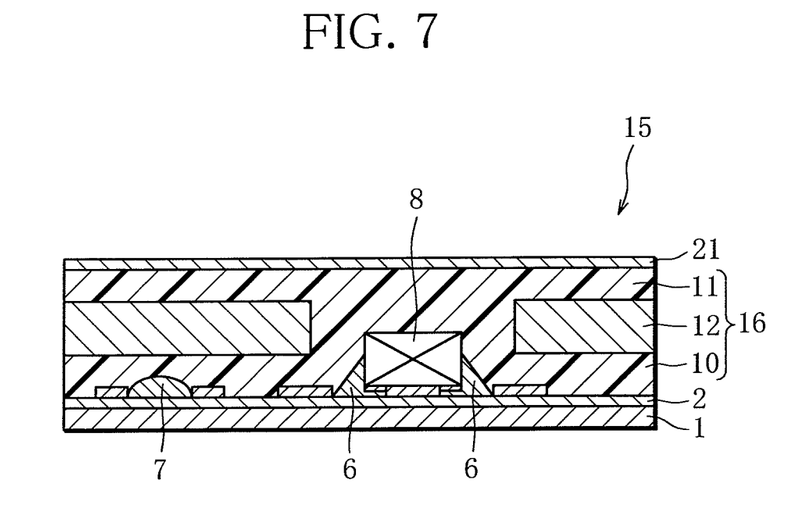
FIG. 7 schematically illustrates the component-embedded substrate manufacturing method according to the present invention.

As a result, a laminated body 15 is formed, as shown in FIG. 7, which is a laminate of the supporting plate 1, the insulating bases 10 and 11, and the core substrate 12. At this stage, the laminated insulating bases 10 and 11 are unified together with part thereof filled into gaps of the through holes 13 and 14. Thus, the insulating bases 10 and 11 and the core substrate 12 form an electrically insulating layer 16. The component 8 is embedded in the insulating layer 16. Since the through holes 13 and 14 are formed in advance, it is possible to suppress the pressure applied to the component 8 during the lamination process. Also, the component 8, if large in size, can be satisfactorily embedded in the insulating layer 16. In the above example, the core substrate 12 is used, but where the elements can be laminated without the need to use the core substrate having the through hole, prepreg alone may be used for the lamination. In this case, the insulating layer 16 is formed in its entirety of the insulating base material.

Figure 8:
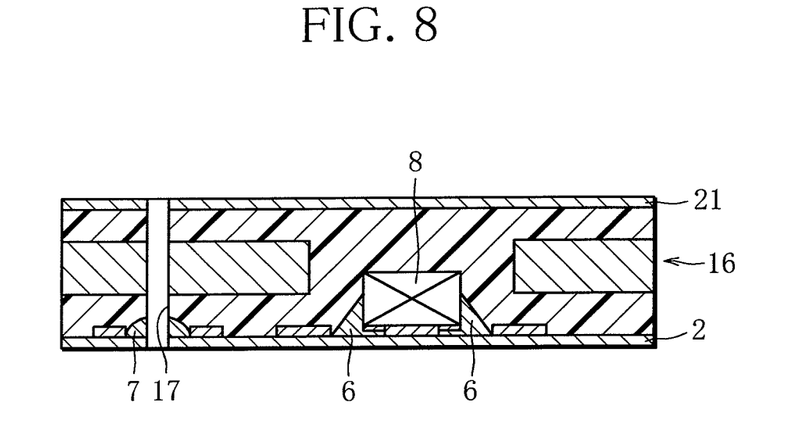
FIG. 8 schematically illustrates the component-embedded substrate manufacturing method according to the present invention.

Then, the supporting plate 1 is removed as shown in FIG. 8. Subsequently, the position of the dummy solder pad 7 is detected, and a reference hole 17 penetrating through the dummy solder pad 7 as well as the conductive layer 2 is formed. The position of the dummy solder pad 7 is detected using an X-ray irradiation device (not shown) which is capable of detecting solder with ease. By using such an X-ray irradiation device, it is possible to accurately detect the dummy solder pad 7. Instead of detecting the dummy solder pad 7 in this way, the conductive layer 2 may be scraped to expose the dummy solder pad 7 so that the dummy solder pad 7 may be directly identified with use of a camera, or without embedding the dummy solder pad 7 in the insulating layer 16, the dummy solder pad 7 may be visually identified.

Figure 9:
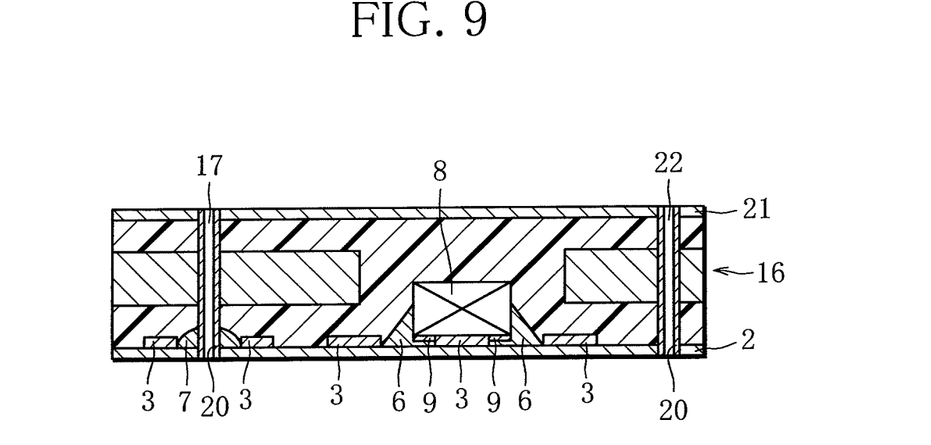
FIG. 9 schematically illustrates the component-embedded substrate manufacturing method according to the present invention.

As illustrated in FIG. 9, a through hole 22 may be formed so as to penetrate through the insulating layer 16 as well as the conductive layers 2 and 21 formed on the opposite sides of the insulating layer 16. Then, an electrically conductive coating 20 is formed on the inner surface of the through hole 22 by plating, whereby the conductive layers on the opposite sides of the insulating layer are electrically connected to each other.

Figure 10:
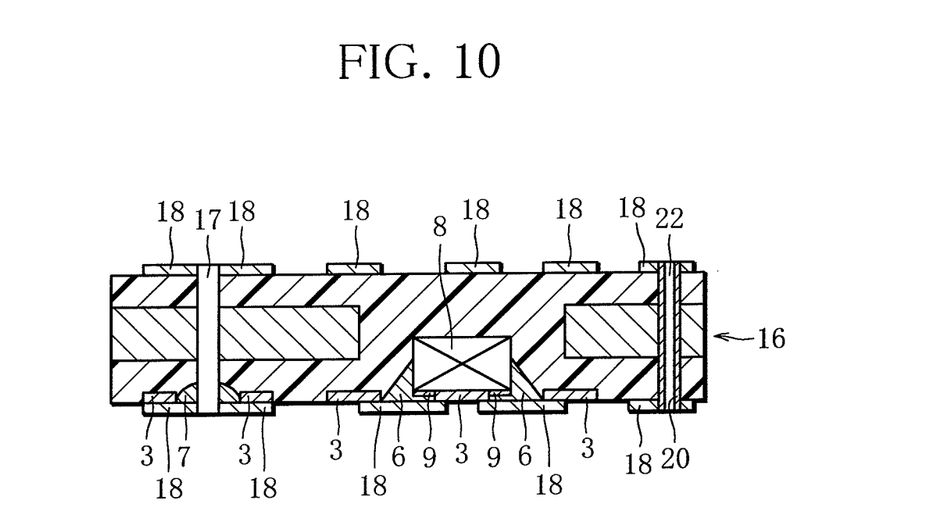
FIG. 10 is a schematic view exemplifying a component-embedded substrate fabricated using the manufacturing method according to the present invention.

Then, as shown in FIG. 10, the conductive layers 2 and 21 are partly removed by etching or the like by using the reference hole 17 as a reference position, to form conductor patterns 18. This completes the fabrication of a component-embedded substrate 19.

Since the component-embedded substrate 19 is manufactured in this manner, positional accuracy of the conductor patterns 18 with respect to the component 8 can be enhanced. Specifically, the actual connection spots 4 and the dummy connection spot 5 are formed on the conductive layer 2 and, therefore, are located on the same plane. Thus, even if the conductive layer 2 is displaced sideways, the interval between each actual connection spot 4 and the dummy connection spot 5 remains unchanged. The component 8 is connected to the actual solder pads 6 formed on the actual connection spots 4, and using as a reference position the dummy solder pad 7 (reference hole 17) formed on the dummy connection spot 5, the conductor patterns 18 are formed. It is therefore possible to improve the positional accuracy of the conductor patterns 18 relative to the component 8.

Also, the dummy solder pad 7 used for improving the positional accuracy can be formed by the same process as that for forming the actual solder pads 6 on which the component 8 is to be mounted, by using the same device. No complicated process is therefore required for improving the positional accuracy of the conductor patterns 18. Further, the actual solder pads 6 and the dummy solder pad 7 are formed by an identical process and accordingly, with identical accuracy. This makes it possible to further improve relative positional accuracy of the actual solder pads 6 and the dummy solder pad 7. In addition, the material for forming a mark or the like, which is conventionally used as a reference position, is unnecessary, whereby increase in cost and labor can be avoided.

When the connection terminals 9 are connected to the actual solder pads 6, the component 8 may be aligned using the dummy solder pad 7 as a reference position. In this case, since the dummy solder pad 7, which is thus used as a reference position when the component 8 is aligned, is also used as a reference position when the conductor patterns 18 are formed, relative positional accuracy of the component 8 and the conductor patterns 18 improves. The dummy solder pad 7 may be formed at any location insofar as it is located on the mounting surface for mounting the component 8, that is, on the same plane as the actual solder pads 6.

Figure 11:
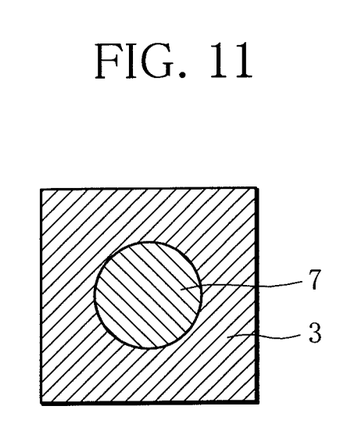
FIG. 11 is a schematic plan view showing an example of a dummy solder pad.
Figure 12:
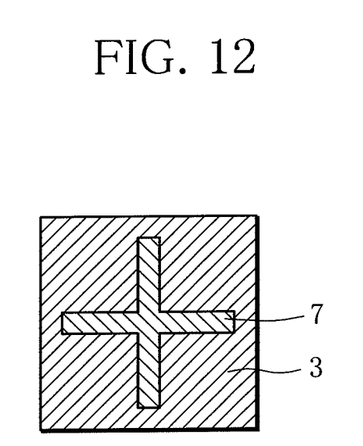
FIG. 12 is a schematic plan view showing another example of the dummy solder pad.
Figure 13:
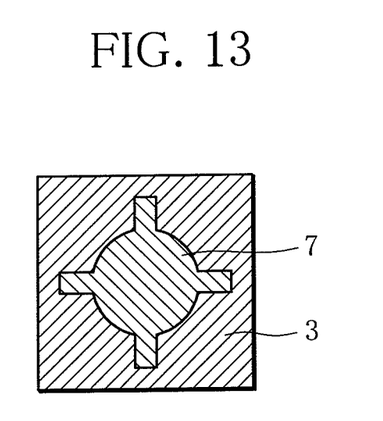
FIG. 13 is a schematic plan view showing still another example of the dummy solder pad.
Figure 14:
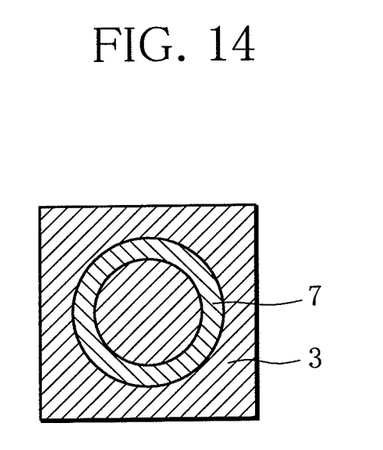
FIG. 14 is a schematic plan view showing a further example of the dummy solder pad.

For the dummy solder pad 7, various shapes may be employed in combination with the solder resist. For example, the dummy solder pad 7 may be circular in shape as viewed in plan, as shown in FIG. 11, or be in the form of a cross as viewed in plan, as shown in FIG. 12. Further, the dummy solder pad 7 may have a shape corresponding to a superimposition of a circle and a cross as viewed in plan, as shown in FIG. 13, or be annular in shape as viewed in plan, as shown in FIG. 14. The dummy solder pad 7 may of course have various other shapes.

EXPLANATION OF REFERENCE SIGNS

1: supporting plate
2: conductive layer
3: mask layer
4: actual connection spot
5: dummy connection spot
6: actual solder pad
7: dummy solder pad
8: electric or electronic component
9: connection terminal
10: insulating base
11: insulating base
12: core substrate
13: through hole
14: through hole
15: laminated body
16: insulating layer
17: reference hole
18: conductor pattern
19: component-embedded substrate
20: conductive coating
21: conductive layer
22: through hole

What is claimed is:

1. A method of manufacturing a component-embedded substrate, comprising:

preparing a thin electrically conductive layer which is to form a conductor pattern;

forming a mask layer on the conductive layer except a plurality of actual connection spots and at least one dummy connection spot on the conductive layer;

forming, with use of solder, actual solder pads and a dummy solder pad on the actual connection spots and the dummy connection spot, respectively, where the conductive layer is exposed;

connecting connection terminals of an electric or electronic component to the actual solder pads;

forming an electrically insulating base of resin which is laminated directly on or indirectly via the mask layer on the conductive layer and in which the component is embedded; and removing part of the conductive layer by using the dummy solder pad as a reference, to form the conductor pattern.

2. The method according to claim 1, wherein a reference hole penetrating through the dummy solder pad and a portion of the conductive layer in contact with the dummy solder pad is formed, and using the reference hole as a reference, part of the conductive layer is removed to form the conductor pattern.

3. The method according to claim 1, wherein an X-ray irradiation device is used when the dummy solder pad is detected as the reference.

4. The method according to claim 1, wherein, when the connection terminals are connected to the actual solder pads, the component is aligned using the dummy solder pad as a reference position.

* * * * *